(12) United States Patent
Weathers et al.

(10) Patent No.: US 8,656,256 B2
(45) Date of Patent: Feb. 18, 2014

(54) APPARATUS AND METHOD FOR MULTI-MODE OPERATION OF A FLASH MEMORY DEVICE

(75) Inventors: Anthony D. Weathers, San Diego, CA (US); Richard D. Barndt, San Diego, CA (US); Ashot Melik-Martirosian, San Diego, CA (US)

(73) Assignee: STEC, Inc., Santa Ana, CA (US)

( * ) Notice: Subject to any disclaimer, the term of this patent is extended or adjusted under 35 U.S.C. 154(b) by 119 days.

(21) Appl. No.: 13/177,482

(22) Filed: Jul. 6, 2011

(65) Prior Publication Data

US 2012/0240012 A1 Sep. 20, 2012

Related U.S. Application Data

(60) Provisional application No. 61/362,263, filed on Jul. 7, 2010.

(51) Int. Cl.
| | |
|---|---|
| *G11C 29/00* | (2006.01) |
| *G06F 13/00* | (2006.01) |
| *G06F 13/28* | (2006.01) |
| *G11C 11/34* | (2006.01) |
| *G11C 16/06* | (2006.01) |
| *G11C 7/00* | (2006.01) |

(52) U.S. Cl.
USPC ...... 714/773; 714/763; 711/102; 365/185.09; 365/200

(58) Field of Classification Search
None
See application file for complete search history.

(56) References Cited

U.S. PATENT DOCUMENTS

| | | | | |
|---|---|---|---|---|
| 7,444,543 | B2 * | 10/2008 | Babudri et al. | 714/6.32 |
| 2006/0062046 | A1 * | 3/2006 | Babudri et al. | 365/185.09 |
| 2008/0072118 | A1 * | 3/2008 | Brown et al. | 714/763 |
| 2009/0327591 | A1 * | 12/2009 | Moshayedi | 711/103 |
| 2010/0122016 | A1 * | 5/2010 | Marotta et al. | 711/103 |
| 2010/0257430 | A1 * | 10/2010 | Chen | 714/773 |
| 2010/0332922 | A1 * | 12/2010 | Chang et al. | 714/704 |
| 2013/0003457 | A1 * | 1/2013 | Wood et al. | 365/185.03 |

OTHER PUBLICATIONS

Jagmohan, et al., "Write Amplification Reduction in NAND Flash through Multi-Write Coding", Storage Conference, 2010, MSST.
Birrell, et al., "A Design for High-Performance Flash Disks", ACM Operating Systems Review, Apr. 2007, pp. 88-93, 41(2).
Hu, et al., "Write amplification analysis in flash-based solid state drives", in SYSTOR, May 4-6, 2009, Haifa, Israel.
Rosenblum, et al., "The design and implementation of a log-structured file system", ACM TOCS, Feb. 1992, pp. 26-52, vol. 10, No. 1.

* cited by examiner

*Primary Examiner* — Guerrier Merant
(74) *Attorney, Agent, or Firm* — McDermott Will & Emery LLP

(57) ABSTRACT

Disclosed is an apparatus and method for operating a multi-level cell (MLC) flash memory circuit. Data is read from a memory block of a plurality of memory blocks in the MLC flash memory circuit, wherein each of the plurality of memory blocks can operate in one of at least three modes of operation comprising an MLC mode, a single-level cell (SLC) mode and a defective mode, and wherein the memory block is initially operating in the MLC mode. Error correction is performed on the read data to correct read errors in the read data. A determination is made if a number of bits corrected by the error correction exceeds a predetermined threshold value. If the number of bits corrected by the error correction exceeds the predetermined threshold value, the operating mode of the memory block is switched from the MLC mode to the SLC mode.

20 Claims, 4 Drawing Sheets

APPARATUS AND METHOD FOR MULTI-MODE OPERATION OF A FLASH MEMORY DEVICE

This application claims priority from U.S. Provisional Application No. 61/362,263, filed Jul. 7, 2010, which is incorporated herein by reference in its entirety.

TECHNICAL FIELD

The subject technology relates generally to memory devices and in particular to multi-level cell flash memory devices.

BACKGROUND

Flash memory is an improved form of Electrically-Erasable Programmable Read-Only Memory (EEPROM). Traditional EEPROM devices are only capable of erasing or writing one memory location at a time. In contrast, flash memory allows multiple memory locations to be erased or written in one programming operation. Flash memory can thus operate at higher effective speeds than traditional EEPROM.

Flash memory enjoys a number of advantages over other storage devices. It generally offers faster read access times and better shock resistance than a hard disk drive (HDD). Unlike dynamic random access memory (DRAM), flash memory is non-volatile, meaning that data stored in a flash storage device is not lost when power to the device is removed. For this reason, a flash memory device is frequently referred to as a flash storage device, to differentiate it from volatile forms of memory. These advantages, and others, may explain the increasing popularity of flash memory for storage applications in devices such as memory cards, USB flash drives, mobile phones, digital cameras, mass storage devices, MP3 players and the like.

Flash memory may use single-level cell (SLC) flash memory, which is configured to store one bit per memory cell, or multi-level cell (MLC) flash memory, which is configured to store multiple bits (e.g., two) of data per memory cell. While MLC flash memory may provide a higher storage density due to its ability to store more than one bit per cell, the maximum number of program/erase cycles that can be performed on MLC flash memory is significantly lower than the maximum number of program/erase cycles that can be performed on SLC flash memory. However, MLC flash memory is significantly less expensive than SLC flash memory and therefore may be the only commercially viable option for many storage applications. Accordingly, there is a need for improved techniques for more efficiently utilizing and managing MLC flash memory for data storage.

SUMMARY

The disclosed subject matter relates to a method for operating a multi-level cell (MLC) flash memory circuit. The method comprises the steps of reading data from a memory block of a plurality of memory blocks in the MLC flash memory circuit, wherein each of the plurality of memory blocks can operate in one of at least three modes of operation comprising an MLC mode, a single-level cell (SLC) mode and a defective mode, and wherein the memory block is initially operating in the MLC mode, and performing error correction on the read data to correct read errors in the read data. The method further comprises the steps of determining if a number of bits corrected by the error correction exceeds a predetermined threshold value, and if the number of bits corrected by the error correction exceeds the predetermined threshold value, switching the operating mode of the memory block from the MLC mode to the SLC mode.

The disclosed subject matter also relates to a system for adjusting a memory parameter associated with a MLC flash memory circuit. The system comprises a host interface configured to be operably coupled to a host device, to receive data from the host device, and to send data to the host device, a memory interface operably coupled to the MLC flash memory circuit, a storage medium interface operably coupled to a volatile memory, and a controller operably coupled to the host interface. The controller is operable to read data from a memory block of a plurality of memory blocks in the MLC flash memory circuit, wherein each of the plurality of memory blocks can operate in one of at least three modes of operation comprising an MLC mode, a SLC mode and a defective mode, and wherein the memory block is initially operating in the MLC mode. The controller is further operable to perform error correction on the read data to correct read errors in the read data, determine if a number of bits corrected by the error correction exceeds a predetermined threshold value, and if the number of bits corrected by the error correction exceeds the predetermined threshold value, switch the operating mode of the memory block from the MLC mode to the SLC mode.

The disclosed subject matter also relates to a machine-readable medium including machine-executable instructions for performing a method for operating a MLC flash memory circuit. The method comprises the steps of reading data from a memory block of a plurality of memory blocks in the MLC flash memory circuit, wherein each of the plurality of memory blocks can operate in one of at least three modes of operation comprising an MLC mode, a SLC mode and a defective mode, and wherein the memory block is initially operating in the MLC mode, and performing error correction on the read data to correct read errors in the read data. The method further comprises the steps of determining if a number of bits corrected by the error correction exceeds a predetermined threshold value, and if the number of bits corrected by the error correction exceeds the predetermined threshold value, switching the operating mode of the memory block from the MLC mode to the SLC mode.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings.

DETAILED DESCRIPTION

Figure 1:
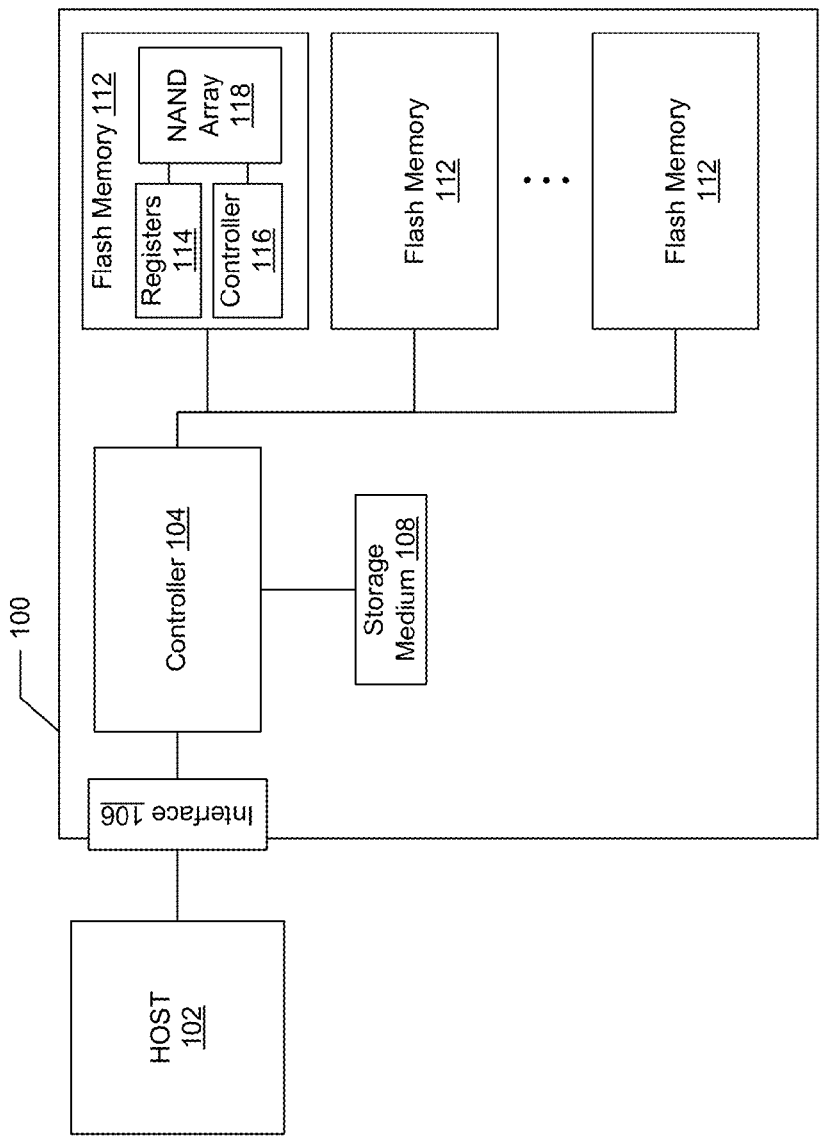
FIG. 1 is a block diagram illustrating components of a data storage system according to example aspects of the subject technology.

FIG. 1 is a block diagram illustrating components of a data storage system according to aspects of the subject technology. As depicted in FIG. 1, data storage system 100 (e.g., a solid state drive) includes data storage controller 104, host interface 106, storage medium 108, and flash memory 112. Controller 104 may include a processor is configured to execute code or instructions to perform the operations and functionality described herein, manage request flow and address mappings, and to perform calculations and generate commands. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing.

Controller 104 also may include several internal components (not shown) such as a read-only memory, a flash component interface (e.g., a multiplexer to manage instruction and data transport along a serial connection to flash memory 112), an I/O interface, error correction circuitry, and the like. In some aspects, all of these elements of controller 104 may be integrated into a single chip. In other aspects, these elements may be separated into one or more discrete components.

One or more sequences of instructions may be stored as firmware on ROM within controller 104 and/or its processor. One or more sequences of instructions may be software stored and read from storage medium 108, flash memory 112, or received from host device 102 (e.g., via host interface 106). ROM, storage medium 108 and flash memory 112 represent examples of machine or computer readable media on which instructions/code executable by controller 104 and/or its processor may be stored. Machine or computer readable media may generally refer to any medium or media used to provide instructions to controller 104 and/or its processor, including both volatile media, such as dynamic memory used for storage media 108 or for buffers within controller 104, and non-volatile media, such as electronic media, optical media, and magnetic media.

Storage medium 108 represents volatile memory used to temporarily store data and information used to manage data storage system 100. The data may include logical to physical address mapping tables, wear-leveling data structures, etc. Storage medium 108 may be static and/or dynamic random access memory (RAM) such as double data rate (DDR) RAM. Other types of RAM also may be used to implement storage medium 108. Memory 108 may be implemented using a single RAM module or multiple RAM modules. While storage medium 108 is depicted as being distinct from controller 104, it should be noted that storage medium 108 may be incorporated into controller 104 without departing from the scope of the subject technology. Alternatively, storage medium 108 may be a non-volatile memory such as a magnetic disk, flash memory, peripheral SSD, or the like.

Host device 102 represents any device configured to be coupled to data storage system 100 and to store data in data storage system 100. Host device 102 may be a computing system such as a personal computer, a server, a workstation, a laptop computer, PDA, smart phone, and the like. Alternatively, host device 102 may be an electronic device such as a digital camera, a digital audio player, a digital video recorder, and the like.

Host interface 106 is configured to be coupled to host device 102, to receive data from host device 102 and to send data to host device 102. Host interface 106 may include both electrical and physical connections for operably coupling host device 102 to controller 104, for example, via the I/O interface of controller 104. Host interface 106 is configured to communicate data, addresses, and control signals between host device 102 and controller 104. Alternatively, the I/O interface of controller 104 may include and/or be combined with host interface 106. Host interface 106 may be configured to implement a standard interface, such as Serial-Attached SCSI (SAS), Fiber Channel interface, PCI Express (PCIe), SATA, USB, and the like. Host interface 106 may be configured to implement only one interface. Alternatively, host interface 106 (and/or the I/O interface of controller 104) may be configured to implement multiple interfaces, which are individually selectable using a configuration parameter selected by a user or programmed at the time of assembly. Host interface 106 may include one or more buffers for buffering transmissions between host device 102 and controller 104.

Flash memory 112 represents a non-volatile memory device for storing data. According to one aspect of the subject technology, flash memory 112 includes, for example, a two-bit MLC flash memory. Flash memory 112 may include a single flash memory device or chip, or, as depicted by FIG. 1, or may include multiple flash memory devices or chips arranged in multiple channels. Flash memory 112 is not limited to any particular capacity or configuration. For example, the number of physical blocks, the number of physical pages per physical block, the number of sectors per physical page, and the size of the sectors may vary within the scope of the subject technology.

Flash memory 112 may have a standard interface specification. This standard ensures that chips from multiple manufacturers can be used interchangeably (at least to a large degree). The interface hides the inner working of the flash memory and returns only internally detected bit values for data. The interface of flash memory 112 may be used to access one or more internal registers 114 and an internal flash controller 116 for communication by external devices. In some aspects, registers 114 may include address, command, and/or data registers, which internally retrieve and output the necessary data to and from a NAND memory cell array 118. For example, a data register may include data to be stored in memory array 118, or data after a fetch from memory array 118, and may also be used for temporary data storage and/or act like a buffer. An address register may store the memory address from which data will be fetched to host 102 or the address to which data will be sent and stored. A command register may be included to control parity, interrupt control, and the like. Internal flash controller 116 may be accessible via a control register to control the general behavior of flash memory 112. Internal flash controller 116 and/or the control register may control the number of stop bits, word length, receiver clock source, and may also control switching the addressing mode, paging control, coprocessor control, and the like.

Controller 104 is configured to store data received from host device 102 into in a memory block of flash memory 112 in response to a write command from host device 102. Controller 104 is further configured to read data stored in the memory block and to transfer the read data to host device 102 in response to a read command from host device 102. Controller 104 may use one or more error correction algorithms when reading and writing data to detect and correct bit errors in the data being written and read. When the bit errors in a particular memory block exceed the correction capabilities of the algorithm, that memory block fails and is preferably removed from use in data storage system 100. As will be described in more detail below, the subject technology proposes changes an operating mode of a memory block operating as MLC flash memory to an SLC operating mode for that memory block rather than removing the memory block from use.

As noted above, flash memory has limited endurance and block erases (e.g., MLC flash memory typically has 10K write-erase cycles). As the limit on the program-erase cycles is approached, and memory blocks begin to fail, the memory blocks taken out of circulation, thus reducing the overall raw capacity of data storage system 100. However, taking defective blocks out of circulation places a greater burden on the remaining blocks and causes them to wear even more rapidly. This results in an acceleration of the deterioration near the end of life.

Log-structured file systems (LFSs) may be used to mitigate the effect of limited endurance and block erases. In an LFS, a translation layer maintains a mapping between logical and physical block addresses. During a write operation, logical block addresses (LBAs) are given and the corresponding logical pages are written (e.g., sequentially) to physical pages in the flash memory. When a logical page is updated, the new data is written to the next available physical page, and the previous physical page holding the original data is marked invalid. The logical to physical page mapping in the translation layer is then updated, so that the logical address will point to the new physical page. This procedure typically helps with wear leveling, where writes are spread across the entire capacity of the data storage system and no individual blocks tend to experience significantly more programming cycles than the rest. However, the free space will eventually be diminished and invalid pages will have to be reclaimed in order to provide new erased blocks for upcoming writes. As noted above, this reclamation corresponds to garbage collection, which involves erasing blocks that contain invalid data and relocating valid data that may be contained in those blocks.

A measure of the number of extra physical writes that take place for each logical write operation is write amplification. As more and more memory blocks fail and are removed from use, the number of physical writes for each logical write increases, which speeds up the wear on the remaining memory blocks and reduces the system endurance. If C is defined as the user capacity and R is defined as the total raw capacity, then an over provisioning ratio can be defined as $\alpha=R/C$. The write amplification, $A(\alpha)$, is a function of the over provisioning ratio. If e is the rated endurance of a flash chip, then system endurance can be given by:

$$E = e \frac{\alpha}{A(\alpha)} \quad (1)$$

From Formula 1, it can be understood that as the number of cycles increases and as defective blocks are taken out of circulation, $\alpha$ decreases and $A(\alpha)$ increases. Thus, both of the terms $\alpha$ and $A(\alpha)$ contribute to the reduction of system endurance. The subject disclosure provides for reducing the rate at which the system deteriorates.

Figure 2:
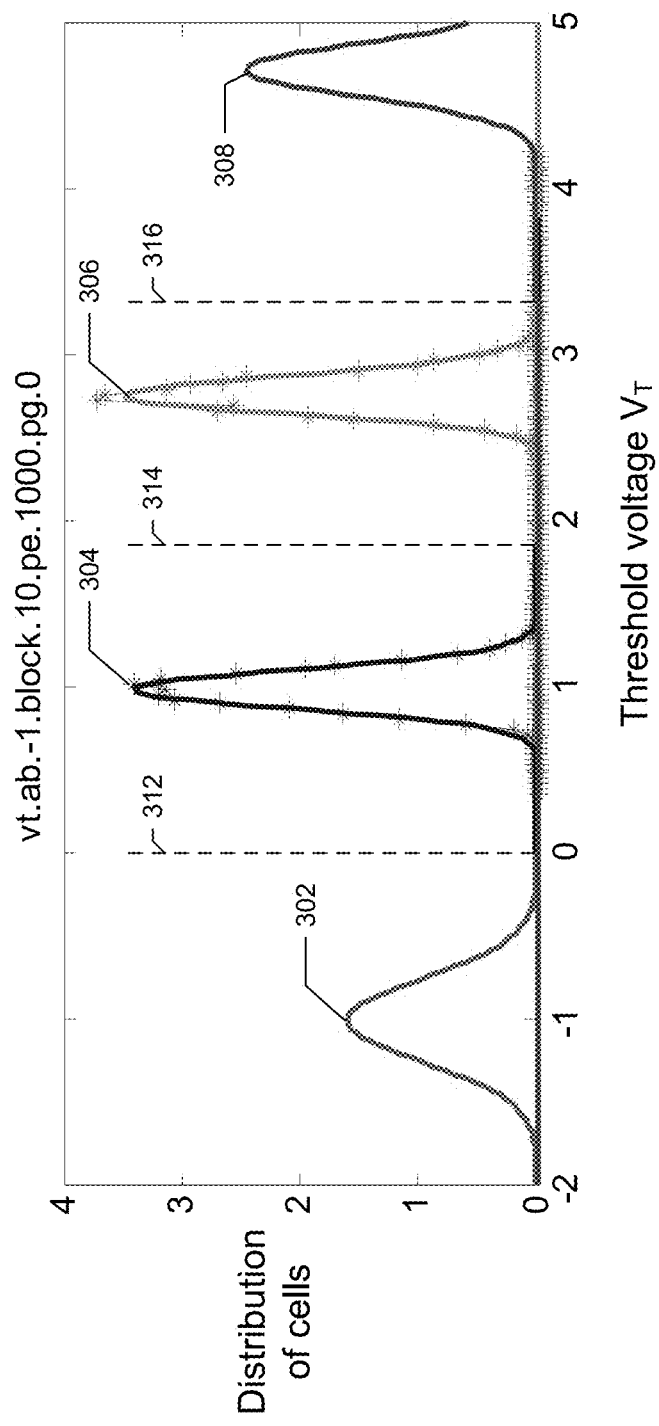
FIG. 2 is a graph illustrating example threshold voltage $V_T$ distributions for an MLC flash memory before being switched from an MLC mode to an SLC mode.

FIG. 2 is a graph illustrating threshold voltage $V_T$ distributions for an MLC flash memory. As noted above, MLC flash is a type of flash memory which stores two (or more) bit values per cell. The bit values are determined by the threshold voltage $V_T$ of the cell, and $V_T$ can be manipulated by the amount of charge put on a floating gate of the cell. Placing charge on the floating gate will increase the threshold voltage of the cell. In the example of FIG. 2, a two-bit MLC is illustrated, where the memory cell is capable of storing four states (or amounts of charge) per cell. These four states equate to different bit values (e.g., 11, 01, 00, 10). However, it should be noted that MLC is not limited to two bits. For example, for a memory cell to hold three bits, it would be necessary to use eight states (e.g., 000, 001, 010, 011, 100, 101, 110, 111).

As can be seen in FIG. 2, four distribution states 302 to 308 are shown, together with corresponding read levels 312 to 316. By altering the amount of charge put on the floating gate of the cell, it is possible to manipulate the threshold voltage $V_T$ value of the cell. The initial or erased state of a cell corresponds to distribution state 302. Placing charge on the floating gate will increase the threshold voltage of the cell, and these charge amounts can be incremented to store charge amounts (e.g., corresponding to distribution states 304 to 308). Thus, it is possible for the two-bit MLC flash memory of FIG. 2 to store two-bit values (e.g., 11, 01, 00, 10). As flash memory ages and the number of programming cycles performed on the memory cells increases, the distributions between to widen and shift. As the distributions begin to overlap on the edges, the likelihood of bit errors increases.

Figure 3:
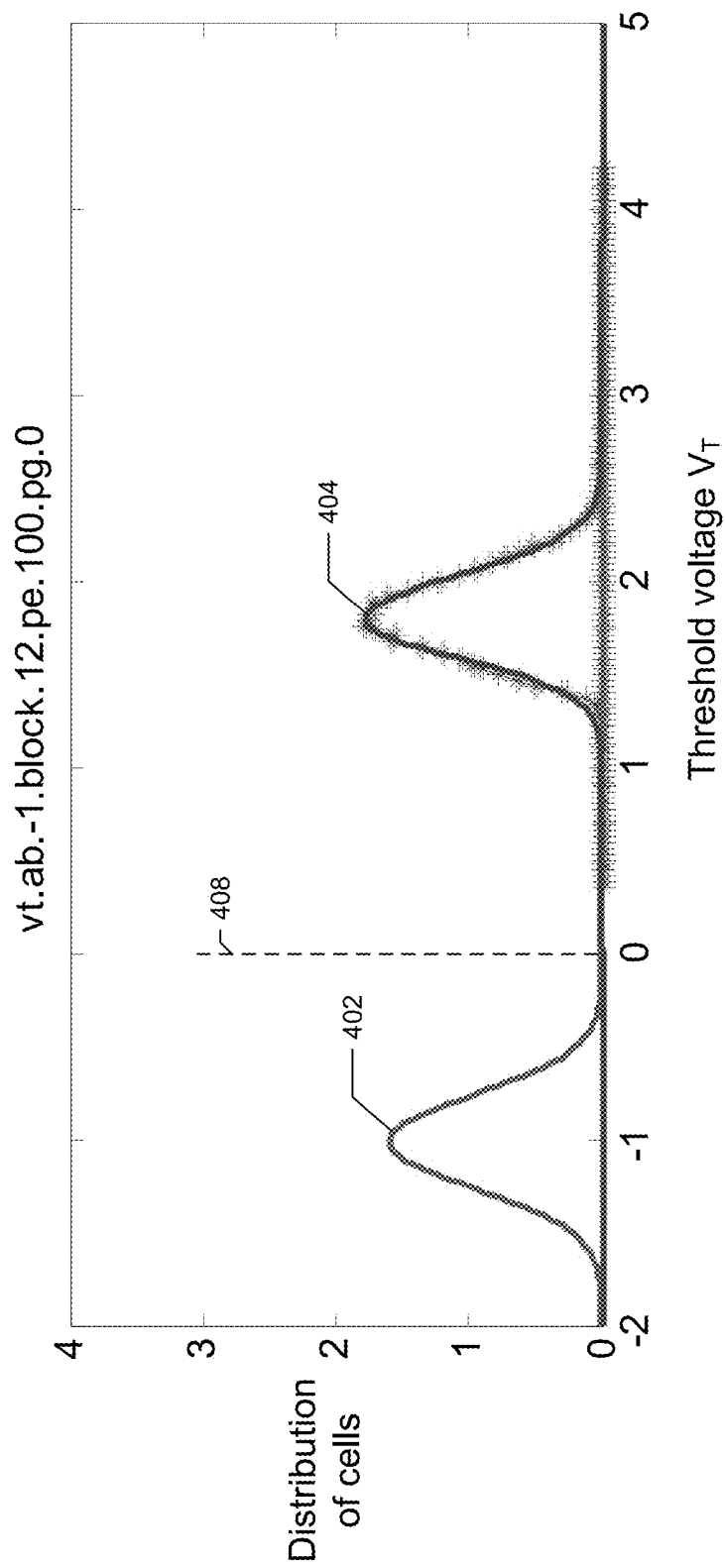
FIG. 3 is a graph illustrating example threshold voltage $V_T$ distributions for an MLC flash memory after being switched from an MLC mode to an SLC mode.

When an MLC flash memory block begins to exhibit bit errors that approach or reach the capabilities of the error correction algorithm being used in the system, the subject technology proposes operating the memory block in an SLC mode rather than marking the memory block as bad and removing it from circulation. As illustrated in FIG. 3, which illustrates example threshold voltage $V_T$ distributions for an SLC flash memory, the number of distributions is reduced from four to two thereby allowing the distributions to be spaced farther apart from each other. While the reduction in the number of distribution states available for the memory cells reduces the number of bits that can be stored in each memory cell from two to one, using the memory block as an SLC memory block allows the memory block to continue to be used at half capacity for data storage and prolong the life of the data storage system.

In summary, the subject technology provides for assigning three modes to memory blocks, including an MLC mode, an SLC mode, and a defective mode. Initially, all memory blocks for a MLC flash memory circuit operate in the MLC mode. When a given memory block fails, that block can be switched from the MLC mode to the SLC mode. During future programming operations, it is possible that the memory block (having been switched to SLC mode) can fail again. At that stage, the block can be switched from SLC mode to a defective mode, so that the block is taken out of circulation. This allows for raw capacity for an MLC flash memory circuit to deteriorate at a slower rate, thereby extending the life of the circuit.

Figure 4:
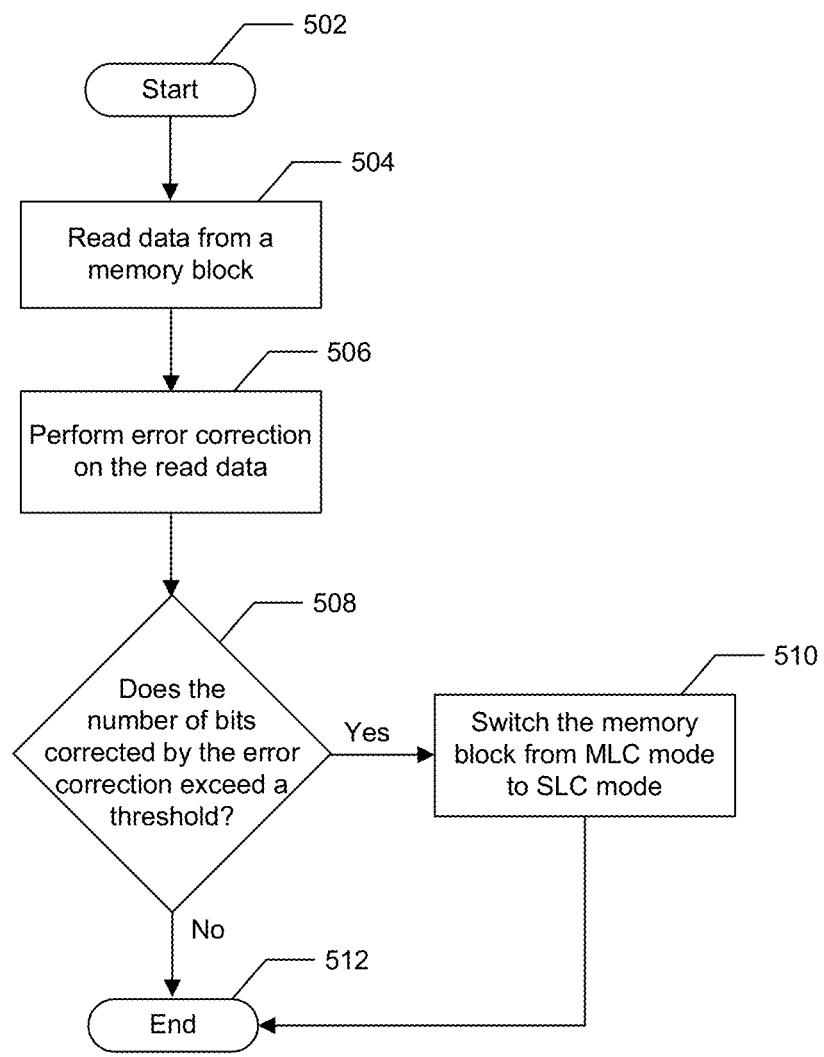
FIG. 4 illustrates a process by which an MLC flash memory circuit is operated.

FIG. 4 illustrates a process by which an MLC flash memory circuit is operated according to the subject technology. Following start block 502, data is read from a memory block of a plurality of memory blocks in a MLC flash memory circuit at step 504. Initially, all of the memory blocks may be operated in the MLC mode.

As noted above with reference to FIG. 1, controller 104 is configured to store data received from a host device 102 into a memory block of flash memory 112 in response to a write command from host device 102. Controller 104 is further configured to read data stored in the memory block, and to transfer the read data to host device 102 in response to a read command from host device 102.

At step at step 506, error correction is performed on the read data to correct read errors in the read data. In this regard, controller 104 is configured to generate an error correction code (ECC) for data in data storage system 100 in conjunction with performing a write operation for writing the data to a memory block in flash memory 112. Controller 104 can write the error correction code associated with the data to the memory block in flash memory 112. During a read operation, controller 104 can use the error correction codes to determine whether a data error occurs when controller 104 reads data from the memory block.

A data error occurs if one or more data bits of the data read from the memory block by controller 104 are corrupt. If a data error occurs when controller 104 reads data from the memory block, controller 104 can perform error correction on the data by using the ECC previously generated for the data.

Thus, at decision step 508, an inquiry is made as to whether a number of bits corrected by the error correction exceeds a predetermined threshold value. If the answer to this inquiry is yes, the operating mode of the memory block is switched from the MLC mode to the SLC mode at step 510, and the process ends at end block 512. The threshold value may be set at the maximum number of bits that can be corrected using the ECC. Alternatively, the threshold value may be set below the maximum number of bits.

As noted above with reference to FIG. 3, each of the plurality of memory blocks can operate in one of at least three modes of operation, including an MLC mode, an SLC mode and a defective mode. To switch operation from the two-bit MLC mode to the SLC mode, controller 104 is configured to mark the particular memory cell as operating in SLC mode and switch from using the memory cells in the memory block for storing two bit values to storing one bit value. According to one aspect, controller 104 may operate an MLC flash memory block in an SLC operating mode by only writing data to the least significant bit (LSB) pages in the memory block and stop using the most significant bit (MSB) pages in the memory block. When switching to operating the memory block in SLC operating mode, the maximum threshold voltage may be lower, which typically results in less damage during the programming process.

Thus, when carrying out the operations of the LFS as described above, the MSB page physical addresses are no longer used when the memory block is operating in SLC mode. Otherwise, the operations by controller 104 for the memory block may remain essentially the same relative to the memory block operating in MLC mode. Accordingly, it is possible that only minor changes in processing the memory block are made (e.g., in the LFS) in order to switch from the MLC mode to the SLC mode.

In switching the memory block from the MLC mode to the SLC mode, it may be necessary to invalidate the memory block, so that it can be reclaimed in a future garbage collection. To invalidate the memory block, controller 104 can be configured to select an available memory block from the plurality of memory blocks, move the data from the memory block to the available memory block, and mark the memory block as invalid. Controller 104 can then assign the operating mode of the memory block to the SLC mode. The data can be associated with an address mapped to the memory block before the data is moved to the available memory block. Moving the data from the memory block to the available memory block can include mapping the address associated with the data to the available memory block.

After the memory block has been marked invalid, garbage collection can be used to reclaim the memory block. For example, garbage collection may be invoked when the number of available pages falls below a threshold, or anytime data storage system 100 of FIG. 1 is not busy. Garbage collection involves erasing blocks that contain invalid data and relocating valid data that may be contained in those blocks. Further, garbage collection involves rewriting valid blocks that were already written in location to another location, and typically occurs in the background so as to be independent of user operations.

After the memory block (having been switched to SLC mode) has been reclaimed, it is possible that the memory block can fail again in subsequent programming. For example, during a subsequent read operation, it is possible for a data error to occur when controller 104 reads data from the memory block. Controller 104 can again perform error correction on the data by using an ECC previously generated for the data for reading the data from the memory block. Further, controller 104 can determine if a number of bits corrected by the error correction exceeds a predetermined threshold value, and if so, can switch the operating mode. This time, since the memory block is already in SLC mode, controller 104 can switch the operating mode to the defective mode, so as to remove the memory block out of circulation for programming.

To manage switching of the memory block from the MLC mode to the SLC mode, and from the SLC mode to the defective mode, controller 104 may be coupled to one or more data structures (not shown) for managing logical block addresses. For example, a table can be used to contain rows with a logical block address, along with the physical address for the corresponding one or two blocks associated with that logical block address. Other tables may allow controller 104 to keep track of the number of blocks that are available (e.g., in MLC or SLC mode). For example, an MLC table can be used to keep track of the number of blocks that are in MLC mode and the physical location of these blocks, and an SLC table can be used to keep track of the number of blocks that are in SLC mode and the physical location of these blocks. A defective blocks table can also be used to store blocks that are defective and should no longer be used. Controller 104 can update the appropriate MLC, SLC and/or defective blocks table when a memory block is switched from the MLC mode to the SLC mode, or from the SLC mode to the defective block mode. Furthermore, controller 104 can access any of the MLC, SLC or defective blocks tables before selecting a block for programming. Thus, controller 104 can configure the operating modes for blocks for better reliability and performance. Of course, the tracking of the MLC, the SLC and the defective modes for each block is not limited to three tables, and other numbers of tables or data structures can be used.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method for operating a multi-level cell (MLC) flash memory circuit, the method comprising the steps of:
    reading data from a memory block of a plurality of memory blocks in the MLC flash memory circuit,
        wherein each of the plurality of memory blocks can operate in one of at least three modes of operation comprising an MLC mode, a single-level cell (SLC) mode and a defective mode,
        wherein the memory block is initially operating in the MLC mode, and
        wherein the MLC flash memory circuit stores an MLC table for tracking memory blocks in the MLC mode, an SLC table for tracking memory blocks in the SLC mode and a defective blocks table for tracking memory blocks in the defective mode;
    performing error correction on the read data to correct read errors in the read data;
    determining if a number of bits corrected by the error correction exceeds a predetermined threshold value;
    if the number of bits corrected by the error correction exceeds the predetermined threshold value, switching the operating mode of the memory block from the MLC mode to the SLC mode; and
    updating at least one of the MLC table, the SLC table or the defective blocks table based on the switching of the operating mode.

2. The method of claim 1, further comprising:
    erasing the memory block;
    writing data to the memory block in SLC mode;
    reading the data from the memory block;
    performing error correction on the read data to correct read errors in the read data;
    determining if a number of bits corrected by the error correction exceeds a predetermined threshold value; and
    if the number of bits corrected by the error correction exceeds the predetermined threshold value, switching the operating mode of the memory block from the SLC mode to the defective mode.

3. The method of claim 1, the switching comprising:
    selecting an available memory block from the plurality of memory blocks;
    moving the data from the memory block to the available memory block;
    marking the memory block as invalid; and
    assigning the operating mode of the memory block to the SLC mode.

4. The method of claim 3, wherein the data is associated with an address mapped to the memory block before the data is moved to the available memory block, and wherein moving the data from the memory block to the available memory block comprises mapping the address associated with the data to the available memory block.

5. The method of claim 1, wherein the memory block operating in the MLC mode is configured to store four states per cell, and wherein the memory block operating in the SLC mode is configured to store two states per cell.

6. The method of claim 5, wherein the memory block comprises a plurality of pages, including a most significant bit (MSB) page and a least significant bit (LSB) page.

7. The method of claim 6, wherein the switching the operating mode of the memory block from the MLC mode to the SLC mode comprises instructing the MLC flash memory circuit to use the LSB page and not the MSB page.

8. A system for adjusting a memory parameter associated with a multi-level cell (MLC) flash memory circuit, comprising:
 a host interface configured to be operably coupled to a host device, to receive data from the host device, and to send data to the host device;
 a memory interface operably coupled to the MLC flash memory circuit;
 a storage medium interface operably coupled to a volatile memory; and
 a controller operably coupled to the host interface, wherein the controller is operable to:
  read data from a memory block of a plurality of memory blocks in the MLC flash memory circuit,
  wherein each of the plurality of memory blocks can operate in one of at least three modes of operation comprising an MLC mode, a single-level cell (SLC) mode and a defective mode,
  wherein the memory block is initially operating in the MLC mode, and
  wherein the MLC flash memory circuit stores an MLC table for tracking memory blocks in the MLC mode, an SLC table for tracking memory blocks in the SLC mode and a defective blocks table for tracking memory blocks in the defective mode;
  perform error correction on the read data to correct read errors in the read data;
  determine if a number of bits corrected by the error correction exceeds a predetermined threshold value;
  if the number of bits corrected by the error correction exceeds the predetermined threshold value, switch the operating mode of the memory block from the MLC mode to the SLC mode; and
  update at least one of the MLC table, the SLC table or the defective blocks table based on the switching of the operating mode.

9. The system of claim 8, wherein the controller is further operable to:
 erase the memory block;
 write data to the memory block in SLC mode;
 read the data from the memory block;
 perform error correction on the read data to correct read errors in the read data;
 determine if a number of bits corrected by the error correction exceeds a predetermined threshold value; and
 if the number of bits corrected by the error correction exceeds the predetermined threshold value, switch the operating mode of the memory block from the SLC mode to the defective mode.

10. The system of claim 8, wherein the switching the operating mode comprises:
 selecting an available memory block from the plurality of memory blocks;
 moving the data from the memory block to the available memory block;
 marking the memory block as invalid; and
 assigning the operating mode of the memory block to the SLC mode.

11. The system of claim 10, wherein the data is associated with an address mapped to the memory block before the data is moved to the available memory block, and wherein moving the data from the memory block to the available memory block comprises mapping the address associated with the data to the available memory block.

12. The system of claim 8, wherein the memory block operating in the MLC mode is configured to store four states per cell, and wherein the memory block operating in the SLC mode is configured to store two states per cell.

13. The system of claim 12, wherein the memory block comprises a plurality of pages, including a most significant bit (MSB) page and a least significant bit (LSB) page.

14. The system of claim 13, wherein the switching the operating mode of the memory block from the MLC mode to the SLC mode comprises instructing the MLC flash memory circuit to use the LSB page and not the MSB page.

15. A non-transitory machine-readable medium including machine-executable instructions for performing a method for operating a multi-level cell (MLC) flash memory circuit, the method comprising the steps of:
 reading data from a memory block of a plurality of memory blocks in the MLC flash memory circuit,
 wherein each of the plurality of memory blocks can operate in one of at least three modes of operation comprising an MLC mode, a single-level cell (SLC) mode and a defective mode,
 wherein the memory block is initially operating in the MLC mode; and
 wherein the MLC flash memory circuit stores an MLC table for tracking memory blocks in the MLC mode, an SLC table for tracking memory blocks in the SLC mode and a defective blocks table for tracking memory blocks in the defective mode;
 performing error correction on the read data to correct read errors in the read data;
 determining if a number of bits corrected by the error correction exceeds a predetermined threshold value;
 if the number of bits corrected by the error correction exceeds the predetermined threshold value, switching the operating mode of the memory block from the MLC mode to the SLC mode; and
 updating at least one of the MLC table, the SLC table or the defective blocks table based on the switching of the operating mode.

16. The machine-readable medium of claim 15, the method further comprising:
 erasing the memory block;
 writing data to the memory block in SLC mode;
 reading the data from the memory block;
 performing error correction on the read data to correct read errors in the read data;
 determining if a number of bits corrected by the error correction exceeds a predetermined threshold value; and
 if the number of bits corrected by the error correction exceeds the predetermined threshold value, switching the operating mode of the memory block from the SLC mode to the defective mode.

17. The machine-readable medium of claim 15, the switching comprising:
 selecting an available memory block from the plurality of memory blocks;
 moving the data from the memory block to the available memory block;
 marking the memory block as invalid; and
 assigning the operating mode of the memory block to the SLC mode.

18. The machine-readable medium of claim 17, wherein the data is associated with an address mapped to the memory block before the data is moved to the available memory block, and wherein moving the data from the memory block to the available memory block comprises mapping the address associated with the data to the available memory block.

19. The machine-readable medium of claim 15, wherein the memory block operating in the MLC mode is configured to store four states per cell, and wherein the memory block operating in the SLC mode is configured to store two states per cell.

20. The machine-readable medium of claim 19, wherein the memory block comprises a plurality of pages, including a most significant bit (MSB) page and a least significant bit (LSB) page.

* * * * *